(12) United States Patent
Li et al.

(10) Patent No.: US 11,973,514 B2
(45) Date of Patent: Apr. 30, 2024

(54) LOW-COMPLEXITY SELECTED MAPPING METHOD USING CYCLICAL REDUNDANCY CHECK

(71) Applicant: CHONGQING UNIVERSITY OF POSTS AND TELECOMMUNICATIONS, Chongqing (CN)

(72) Inventors: Guojun Li, Chongqing (CN); Junbing Li, Chongqing (CN); Congji Yin, Chongqing (CN); Changrong Ye, Chongqing (CN)

(73) Assignee: CHONGQING UNIVERSITY OF POSTS AND TELECOMMUNICATIONS, Chongqing (CN)

( * ) Notice: Subject to any disclaimer, the term of this patent is extended or adjusted under 35 U.S.C. 154(b) by 0 days.

(21) Appl. No.: 18/008,468

(22) PCT Filed: Feb. 1, 2021

(86) PCT No.: PCT/CN2021/074645
§ 371 (c)(1),
(2) Date: Dec. 6, 2022

(87) PCT Pub. No.: WO2022/077809
PCT Pub. Date: Apr. 21, 2022

(65) Prior Publication Data
US 2023/0208443 A1    Jun. 29, 2023

(30) Foreign Application Priority Data
Oct. 14, 2020    (CN) .......................... 202011097616.7

(51) Int. Cl.
*H03M 13/09*    (2006.01)
*H03M 13/15*    (2006.01)

(52) U.S. Cl.
CPC ......... *H03M 13/09* (2013.01); *H03M 13/154* (2013.01)

(58) Field of Classification Search
CPC .... H03M 13/09; H03M 13/154; H03M 13/13; H04L 1/0041; H04L 1/0042;
(Continued)

(56) References Cited

U.S. PATENT DOCUMENTS 6,526,531 B1    2/2003  Wang
2011/0090972 A1*  4/2011  Jong-Seon .......... H04L 27/2621
                                                  375/341
(Continued)

FOREIGN PATENT DOCUMENTS

CN         1571284 A      1/2005
CN       102325001 A      1/2012
(Continued)

OTHER PUBLICATIONS

International Search Report for PCT/CN2021/074645 mailed Jul. 15, 2021, ISA/CN.
(Continued)

*Primary Examiner* — Shelly A Chase
(74) *Attorney, Agent, or Firm* — Yue (Robert) Xu; Apex Attorneys at Law, LLP

(57) ABSTRACT

A low-complexity selective mapping method using cyclic redundancy check is provided. In performing coding, a transmitter adds a check bit to information bits to be transmitted to obtain modulated data. Demodulation is performed on an M-order modulation symbol received by a receiver to obtain a decoding result of a coding polynomial of the modulation symbol and bit information received by the receiver. A modulo-2 division result of the decoding result of the coding polynomial and a generation polynomial is calculated. In a case that a remainder of the modulo-2
(Continued)

division result is equal to zero, if the modulated data corresponding to the same index value of the receiver and the transmitter are identical, a current iteration is stopped, and a current value is outputted as a phase rotation sequence index recovery value. Finally, the receiver obtains a decoded signal.

7 Claims, 6 Drawing Sheets

(58) Field of Classification Search
CPC ... H04L 1/0047; H04L 1/0061; H04L 27/262; H04L 27/2621
See application file for complete search history.

(56) References Cited

U.S. PATENT DOCUMENTS

| 2014/0016721 | A1* | 1/2014 | Xin | H04L 1/007 375/295 |
| 2017/0332323 | A1* | 11/2017 | Yang | H04L 27/2621 |

FOREIGN PATENT DOCUMENTS

| CN | 102694625 A | 9/2012 |
| CN | 112202454 A | 1/2021 |

OTHER PUBLICATIONS

Low Complexity Data Decoding for SLM-Based OFDM Systems without Side Information, IEEE Communications Letters, vol. 15, No. 6, Jun. 2011.

The European search report issued on Oct. 30, 2023 for EP21878867.7.

Al-Rayif Mohammed I et al: "A Novel Iterative-SLM Algorithm for PAPR Reduction in 5G Mobile Fronthaul Architecture" IEEE Photonics Journal, IEEE, USA, vol. 11, No. 1, Feb. 1, 2019, pp. 1-12, XP011709745, DOI: 10.1109/JPHOT.2019.2894986.

Li Junbing et al: "A Low-Complexity CRC-Based Decoding Algorithm for SLM-ML OFOM Systems", IEEE Wireless Communications Letters, IEEE, PISCATAWAY, NJ, USA, vol. 10, No. 6, Dec. 4, 2020, pp. 1144-1147,XP011859283,ISSN: 2162-2337, DOI: 10.1109/LWC.2020.3042676.

Yuan Jian-Guo et al: "A novel improved SLM scheme of the PAPR reduction technology in CO-OFOM systems", Optoelectronics Letters, SPRINGER, GERMANY, vol. 13, No. 2, Apr. 23, 2017, pp. 138-142, XP036217588, ISSN: 1673-1905, 001: 10. 1007/S11801-017-6265-9.

* cited by examiner

LOW-COMPLEXITY SELECTED MAPPING METHOD USING CYCLICAL REDUNDANCY CHECK

This application is the national phase of International Patent Application No. PCT/CN2021/074645, titled "LOW-COMPLEXITY SELECTED MAPPING METHOD USING CYCLICAL REDUNDANCY CHECK", filed on Feb. 1, 2021, which claims the priority to Chinese Patent Application No. 202011097616.7 titled "LOW-COMPLEXITY SELECTED MAPPING METHOD USING CYCLICAL REDUNDANCY CHECK", filed on Oct. 14, 2020 with the China National Intellectual Property Administration (CNIPA), both of which are incorporated herein by reference in their entireties.

FIELD

The present disclosure relates to the technical field of communication, and in particular to a low-complexity selective mapping (SLM) method using cyclic redundancy check (CRC).

BACKGROUND

Due to the advantages of anti-multipath and high spectral efficiency, orthogonal frequency division multiplexing (OFDM) with which subcarriers are superimposed and then transmitted, as a modulation manner, is used in 3G/4G/5G, thereby effectively improving the transmission rate. However, the superposition of multiple subcarriers causes a high peak-to-average power ratio (PAPR) of an OFDM symbol, thus a transmitter with a high transmission power and a power amplifier with a wide linear range are required to ensure stable data transmission.

In order to reduce PAPR, many algorithms are proposed, and an SLM algorithm is one of the most optimal technologies to suppress the PAPR. According to a phase recovery manner, SLM includes SI-SLM and NSI-SLM in the SLM algorithm. For the SI-SLM, the accurate transmission of SI is ensured, the decoding is simple, and BER performance of a system is severely restricted by the SI. For the NSI-SLM, a maximum likelihood decoding is performed at a receiver in most cases, avoiding the transmission of SI information.

According to "J. Park, E. Hong and D. Har, "Low Complexity Data Decoding for SLM-based OFDM systems without side information" in IEEE communications letters, vol. 15, No. 6, pp. 611-613, June 2011", an NSI-SLM algorithm with a comb-type pilot phase sequence is provided. However, with the algorithm, it is still required to perform maximum likelihood (ML) calculation on all phase sequences at the receiver.

SUMMARY

In order to stop the iteration in the conventional SLM algorithm and improve the calculation speed, a low-complexity selective mapping method using cyclic redundancy check is provided according to the present disclosure. The method includes:

adding, by a transmitter in performing coding, a check bit and an auxiliary check bit to information bits to be transmitted, and then performing modulation, by the transmitter, to obtain modulated data A(n);

multiplying, by the transmitter, the modulated data A(n) to be transmitted by Q groups of different phase sequences to perform phase rotation to obtain a modulation symbol A'(n), and transmitting, by the transmitter, a sequence with a smallest PAPR;

performing demodulation on an M-order modulation symbol $\hat{A}'_Q(n)$ received by a receiver to obtain a decoding result of a coding polynomial of the modulation symbol and bit information received by the receiver;

calculating a modulo-2 division result of the decoding result of the coding polynomial and a generation polynomial;

in a case that a remainder of the modulo-2 division result is not equal to zero, performing a next iteration until the remainder of the modulo-2 division result is equal to zero or the number of iterations is equal to Q;

in a case that a remainder of the modulo-2 division result is equal to zero, if modulation data corresponding to an index directory s(m) is consistent with a decoding result of auxiliary check information in an i-th iteration corresponding to the directory, that is, $A(s(m))=\hat{A}_i(s(m))$, and auxiliary verification is successful, stopping the i-th iteration, and outputting a current value of i as a phase rotation sequence index recovery value; and if $A(s(m)) \neq \hat{A}_i(s(m))$, and auxiliary verification fails, determining whether the number of iterations is equal to Q, performing a next iteration in a case that the number of iterations is not equal to Q, and performing an ML algorithm on $\hat{A}_9(s(m))$ to obtain a phase rotation sequence index recovery value in a case that the number of iterations is equal to Q; and obtaining a decoded signal by the receiver based on the phase rotation sequence index recovery value and a received modulation symbol Y'(n') after the check bit is removed.

In an embodiment, the information bit after being adding with the check bit by the transmitter is expressed as:

$$A(n) = \begin{cases} 0 & n = (2s(m)-1, 2s(m)) & 1 \le m \le \frac{n}{2} \\ A(n) & n \ne (2s(m)-1, 2s(m)) & n = (1, 2 \ldots n') \\ R(l) & l = (1, 2, \ldots r) & n = (n'+1, n'+2 \ldots n'+r) \end{cases}$$

where A(n) represents the information bit after being added with the check bit by the transmitter; one symbol includes n bits, and the n bits includes r check bits, m auxiliary check bits, and n' data bits to be transmitted; s(m) represents an m-th element in an index vector of a QPSK modulation symbol of A(n); and R(l) represents an l-th check bit.

In an embodiment, the M-order modulation symbol $\hat{A}'_Q$ (n) received by the receiver is expressed as:

$$\hat{A}'_Q(n) = U_Q Y(n)$$

where $U_Q$ represents a phase rotation matrix formed by the Q groups of different phase sequences, Y'(n) represents a modulation symbol obtained by performing IFFT transformation on a received signal, $\hat{H}(n)$ represents a channel response estimation value, and y(n) represents the received signal received by the receiver.

In an embodiment, the coding polynomial is expressed as:

$$C(x)=A(x) \times x^r + R(x) = Q(x)G(x)$$

where C(x) represents the coding polynomial, A(x) represents an information polynomial, R(x) represents a remainder polynomial, Q(x) represents a quotient polynomial, G(x) represents the generation polynomial, and x represents a position parameter and is not described redundantly.

In an embodiment, the receiver obtains the decoded signal based on the phase rotation sequence index recovery value and the received modulation symbol Y'(n') after the check bit is removed by using the following equation:

$$Â'(n')=Y'(n')·U_{\hat{q}}$$

where Â'(n') represents the decoded signal, and $U_{\hat{q}}$ represents a rotation phase corresponding to the phase rotation sequence index recovery value.

Compared with the NSI-SLM solution with comb-type pilot in the ML algorithm, cyclic redundancy check (CRC) is adopted in the present disclosure to stop calculation in advance. According to the present disclosure, a great computation gain can be achieved, and a same PAPR suppression effect as the conventional technology can be achieved by using a simple phase sequence. In addition, auxiliary verification is performed by using a small amount of known information according to the present disclosure without improving the bit error rate (BER).

DETAILED DESCRIPTION OF EMBODIMENTS

Figure 1:
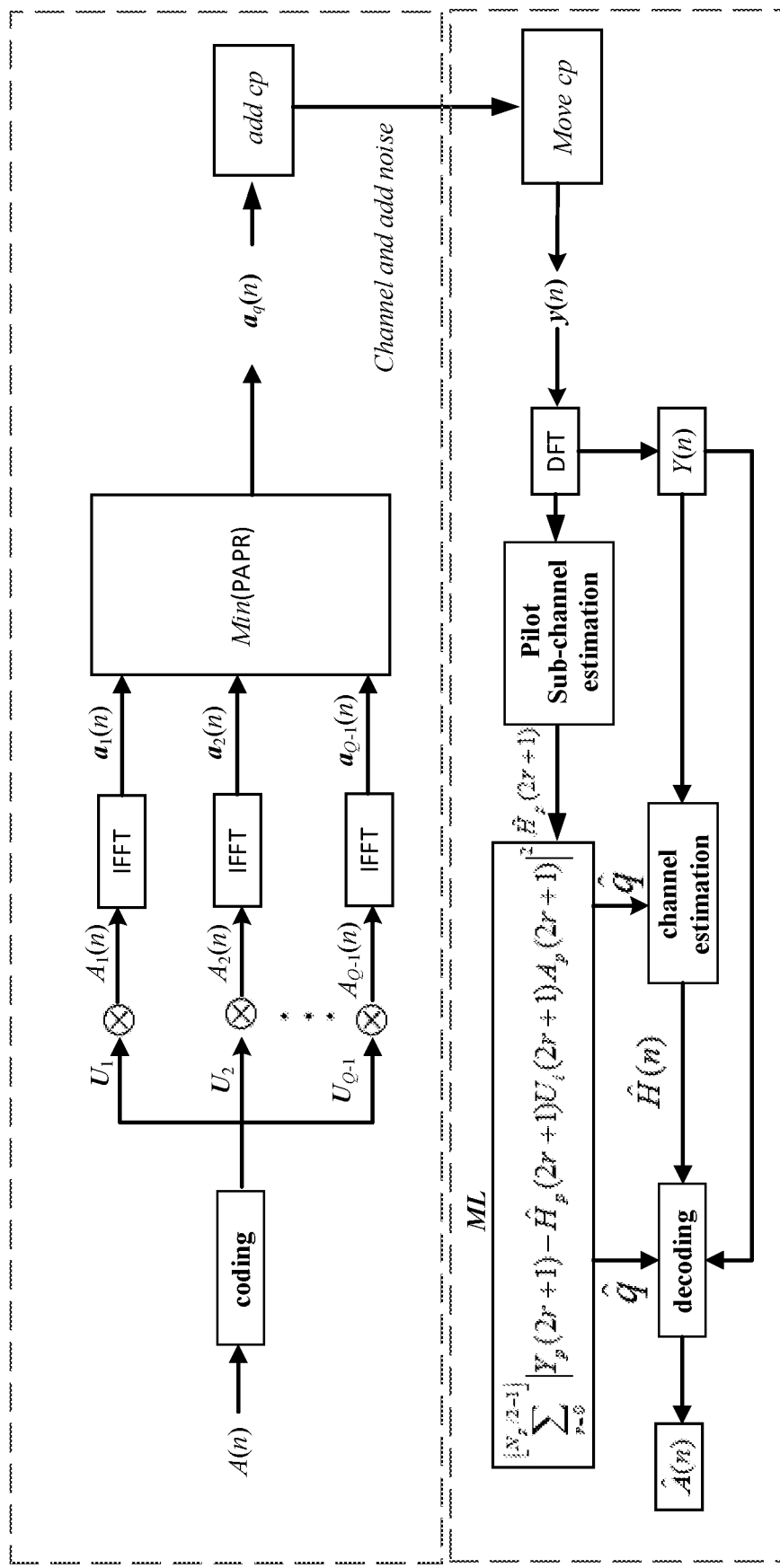
FIG. 1 is a system block diagram of an SLM solution based on a comb-type pilot OFDM system according to the conventional technology.

The technical solutions in the embodiments of the present disclosure are described clearly and completely in conjunction with the drawings in the embodiments of the present disclosure hereinafter. It is apparent that the described embodiments are only some embodiments of the present disclosure, rather than all embodiments. All other embodiments obtained by those skilled in the art based on the embodiments of the present disclosure without any creative work fall within the protection scope of the present disclosure.

A low-complexity selective mapping method using cyclic redundancy check is provided according to the present disclosure. The method includes the following operations.

A transmitter in performing coding adds a check bit to information bits to be transmitted to obtain modulated data A(n).

The transmitter multiplies the modulated data A(n) to be transmitted by Q groups of different phase sequences to perform phase rotation to obtain a modulation symbol A'(n). That is, A'(n) is an M-order modulation symbol corresponding to A(n). The transmitter transmits a sequence with a smallest PAPR.

Demodulation is performed on an M-order modulation symbol Â'$_Q$(n) received by a receiver to obtain a decoding result of a coding polynomial of the modulation symbol and bit information received by the receiver.

A modulo-2 division result of the decoding result of the coding polynomial and a generation polynomial is calculated. In a case that a remainder of the modulo-2 division result is not equal to zero, a next iteration is performed until the remainder of the modulo-2 division result is equal to zero or the number of iterations is equal to Q.

In a case that a remainder of the modulo-2 division result is equal to zero, if A(s(m))=Â$_i$(s(m)), it indicates that auxiliary verification is successful, a current iteration is stopped, and a current value of i is outputted as a phase rotation sequence index recovery value.

If $A(s(m)) \neq Â_i(s(m))$, it indicates that auxiliary verification fails, and it is determined whether the number of iterations is equal to Q. In a case that the number of iterations is not equal to Q, a next iteration is performed. In a case that the number of iterations is equal to Q, an ML algorithm is performed on Â$_i$(s(m)) to obtain a phase rotation sequence index recovery value.

The receiver obtains a decoded signal based on the phase rotation sequence index recovery value and Y'(n').

In the SLM, the transmitter multiplies the modulated data A(n) to be transmitted by Q groups of different phase sequences $U_Q=(U_1, U_2, \ldots, U_q, \ldots U_Q)$, $U_q=[u_{q,1}, u_{q,2} \ldots u_{q,N-1}]^T$, $q \in (1, Q)$, $u_{q,n}=e^{j\phi_{q,n}}$, to perform phase rotation to obtain $A_Q(n)$. $\phi_{q,n}$ represents a uniform random number ranging from 0 and $2\pi$. Usually, for facilitating calculation, $$\varphi_{q,n} = \{\pm\pi\} \text{ or } \varphi_{q,n} = \left\{\pm\pi, \pm\frac{\pi}{2}\right\}.$$

N represents the number of subcarriers. IFFT is calculated, and a PAPR of each of the sequences is calculated. A sequence with a smallest PAPR is transmitted. The transmitted sequence is expressed as:

$$a_q(n) = \min_{q \in (1,Q)} PAPR(a(n) \cdot U_q)$$

where a(n) represents a time-domain symbol after IFFT transformation, and $a_q(n)$ represents the q-th group of time-domain symbol after IFFT transformation that is determined as data to be transmitted.

FIG. 1 is a system block diagram of an SLM solution based on a comb-type pilot OFDM system according to the conventional technology. An input signal bit A(n) may be expressed as:

$$A(n) = A(mL + l) = \begin{cases} A_{pilot}(m) & l = 0 \\ A_{data}(mL + l) & l = 1, 2 \ldots L - 1 \end{cases}$$

where $A_{pilot}(m)$ represents a pilot bit, L represents an interval between two adjacent pilots, and $A_{data}(mL+1)$ represents a data bit.

The phase sequence $U_q$ includes a pilot phase sequence $U_q(P)$ and a data phase $U_q(d)$. The phase sequence is expressed as:

$$u_{q,p}(m) = \begin{cases} 1 & m = 2r_0 \\ e^{j\phi_{q,m}} & m = 2r_0 + 1 \end{cases}$$

where $$0 \le r_0 \le \left\lfloor \frac{N_P}{2} - 1 \right\rfloor,$$

$N_p$ represents the number of pilot subcarriers, and $\lfloor \ \rfloor$ represents a round-down operation.

At the receiver, channel estimation is performed by using the pilot signal $A_{pilot}(m)$ to obtain a channel response estimation value $\hat{H}_{pilot}(k)$. Then, interpolation operation is performed on $\hat{H}_{pilot}(2r)$ and $\hat{H}_{pilot}(2r+2)$ to obtain $\hat{H}_{pilot}(2r)$.

The phase rotation sequence index recovery value q is obtained by using the following equation:

$$\hat{q} = \min_{q \in (1,Q)} \sum_{r=0}^{\lfloor (N_p-1)/2-1 \rfloor} |Y_{pilot}(2r+1) - \hat{H}_{pilot}(2r+1)U_{q,2r+1}A_{pilot}(2r+1)|^2$$

First Embodiment

With the SLM algorithm, phase recovery is performed at the receiver. Based on the ML-SLM solution with high-complexity calculation, a low-complexity method for performing phase recovery using CRC is provided according to the present disclosure, stopping calculation when a check value is equal to 0. The basic idea of the present disclosure is that in an ideal condition, if a phase is recovered correctly, a CRC value is equal to 0. Using known information for auxiliary verification can effectively reduce the possibility of false detection.

It is assumed that $A(x)$ represents an information polynomial, $G(x)$ represents a generation polynomial, $Q(x)$ represents a quotient polynomial, $R(x)$ represents a remainder polynomial, the order of $A(x)$ is k, and the order of $R(x)$ is r, it indicates that the length of the information bit is k and the length of the check bit is r.

CRC may be expressed as:

$$\frac{A(x) \times x^r}{G(x)} = Q(x) + \frac{R(x)}{G(x)}$$

The coding polynomial $C(x)$ may be expressed as:

$$C(x) = A(x) \times x^r + R(x) = Q(x)G(x)$$

At the receiver, it is determined whether a bit error occurs based on a modulo-2 division result of a decoding result $\hat{C}(x)$ of $C(x)$ and $G(x)$. The modulo-2 division result is expressed as:

$$\frac{\hat{C}(x)}{G(x)} = \hat{Q}(x) + \frac{\hat{R}(x)}{G(x)}$$

In a case that $\hat{C}(x)=C(x)$, $\hat{R}(x)$ is equal to 0. In a case that $\hat{R}(x)=0$, $\hat{C}(x)$ may be not equal to $C(x)$ due to false detection $$P = \frac{1}{2^r}.$$

Figure 2:
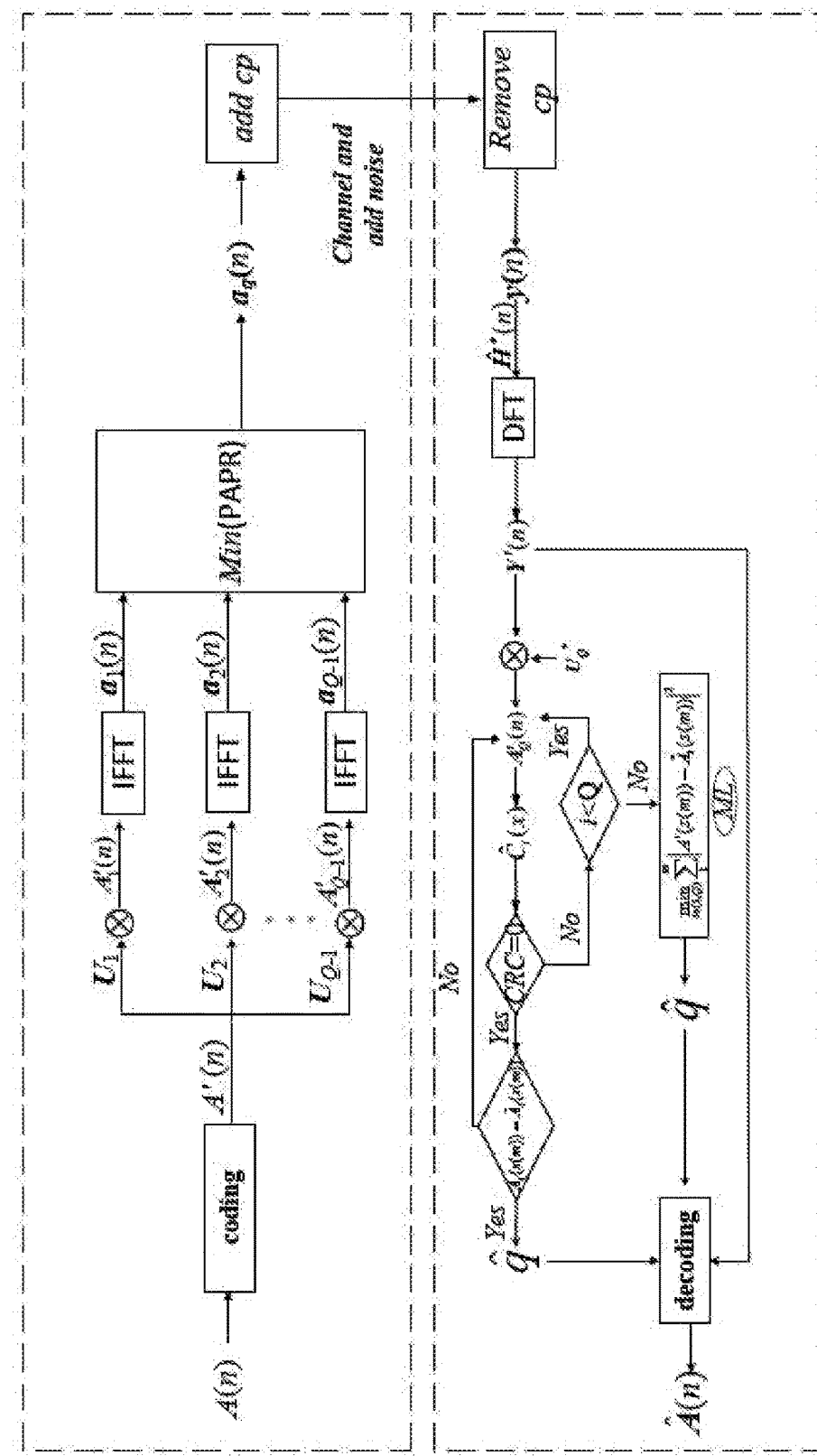
FIG. 2 is a system block diagram of a low-complexity selective mapping method using cyclic redundancy check according to the present disclosure.

As shown in FIG. 2, a coefficient of a polynomial, that is, a codeword, corresponds to a random binary sequence. A codeword $C(g,r)$, $g=k+r$ may be obtained based on $C(x)$.

According to the above CRC check, a check bit may be added to the information bits to obtain $A(n)$. In FIG. 2, $A'(n)$ is a QPSK modulation symbol of $A(n)$. After the check bit is added, $A(n)$ may be expressed as:

$$A(n) = \begin{cases} 0 & n = (2s(m)-1, 2s(m)) & 1 \le m \le -\frac{n}{2} \\ A(n) & n \ne (2s(m)-1, 2s(m)) & n = (1, 2 \ldots n') \\ R(l) & l = (1, 2, \ldots r) & n = (n'+1, n'+2 \ldots n'+r) \end{cases}$$

where an integer vector $S=\{s(1), s(2) \ldots s(m)\}$ represents an index in $A'(n)$; $R(l)$ represents a coefficient corresponding to the polynomial $R(x)$, that is, the number of the check bit; and one symbol includes n bits, including r check bits, m auxiliary check bits, n'=n−r data bits to be transmitted, and n−r−m data bits.

At the receiver, a received signal is expressed as:

$$y(n) = H(n) \cdot a_q(n) + n_0$$

where $n_0$ represents added Gaussian white noise.

The channel response estimation value $\hat{H}(n)$ may be obtained based on the pilot:

$$\hat{H}(n) = \frac{y_p(n)}{x_p(n)}$$

where $y_p(n)$ represents a received pilot signal, and $x_p(n)$ represents a pilot signal.

$Y(n)$ is obtained by performing FFT operation on the received signal $y(n)$. $\varphi_{g,n}=\{\pm\pi\}$ represents a phase factor in a phase rotation matrix $U_Q$, and $U_Q=U_Q^*$. An M-order modulation symbol $A'(n)$ is expressed as:

$$\hat{A}'(n') = Y(n') \otimes U_{\hat{q}}$$

$\hat{C}(x)$ and $\hat{A}_i(s(m))$ may be obtained by performing demodulation on $\hat{A}'_Q(n)$. A CRC check may be performed to determine whether to stop the iteration, which includes the following operations.

In a case that $\hat{R}_i(x) \ne 0$, it indicates $\hat{C}_i(x) \ne C(x)$ and $Ui \ne Uq$, a next iteration is performed until $\bar{R}_i(x)=0$ or $i=Q$. The process is expressed as:

$$\left. \begin{array}{l} \frac{\hat{R}_i(x)}{G(x)} = \frac{\hat{C}_i(x)}{G(x)} - \hat{Q}(x) \ne 0 \\ A(s(m)) - \hat{A}_i(s(m)) = 0 \end{array} \right\} \Rightarrow i = Q$$

In a case that $U_i = U_q$, $\hat{R}_i(x) \ne 0$ due to the bit error $\hat{C}_i(g,r)$, the iteration in the algorithm is performed until the last time.

In a case that $\hat{R}_i(x)=0$, in order to avoid misjudgment caused by missed detection and bit error, it is required to perform auxiliary verification on $\hat{C}_i(g,r)$. In a case that an auxiliary verification is performed as the following expression:

$$\left.\begin{array}{c}\frac{\hat{R}_i(x)}{G(x)} = \frac{\hat{C}_i(x)}{G(x)} - \hat{Q}(x) = 0 \\ A(s(m)) - \hat{A}_i(s(m)) \neq 0\end{array}\right\} \Rightarrow i \neq q$$

$\hat{C}_i(g,r)=C(g,r)+\alpha G(k)\neq C(g,r)$ due to a wrong phase sequence. Although $\hat{R}_i(x)=0$, $A(s(m))-\hat{A}_i(s(m))\neq 0$, and the auxiliary verification fails. Thus, it is required to perform a next iteration.

In a case that an auxiliary verification is performed as the following expression:

$$\left.\begin{array}{c}\frac{\hat{R}_i(x)}{G(x)} = \frac{\hat{C}_i(x)}{G(x)} - \hat{Q}(x) = 0 \\ A(s(m)) - \hat{A}_i(s(m)) = 0\end{array}\right\} \Rightarrow i = \hat{q} = q$$

$A(s(m))=\hat{A}_i(s(m))$, $\hat{C}_i(g,r)=C(g,r)$, and $i=\hat{q}=q<Q$, where $i$ represents the number of iterations, $q$ represents a phase rotation sequence index value, and $\hat{q}$ represents a phase rotation sequence index recovery value. It indicates that the phase recovery calculation in the method according to the present disclosure may be stopped, and it is unnecessary to perform ML calculation.

The case that $i=Q$ is caused by determining a correct phase as a wrong phase (that is, $\hat{R}_i(x)=0$) or the selected phase sequence being equal to Q. In the case that $i=Q$, it is required to perform ML solution according to the method of the present disclosure, and ML calculation is performed on $\hat{A}_Q(s(m))$ by using the following equation:

$$\hat{q} = \min_{i\in(1,Q)} \sum_{m=1}^{m} |\hat{A}'_i(s(m)) - A'(s(m))|^2$$

Finally, the phase rotation sequence index recovery value $\hat{q}$ is expressed as:

$$\hat{q} = \begin{cases} i & i < Q, A(s(m)) - \hat{A}_i(s(m)) = 0 \\ \min_{q\in(1,Q)} \sum_{1}^{m} |\hat{A}'_q((s(m)) - A'(s(m))|^2 & i = Q \end{cases}$$

At the receiver, the decoded signal $\hat{A}'(n')$ is expressed as:

$\hat{A}'(n')=Y(n')\cdot U_{\hat{q}}$

Second Embodiment

In the embodiment, BERs and computation complexities corresponding to different channels according to different SLM solutions are compared, and the influence of the number of the phase sequence groups on the BER and the computation complexity is further analyzed. Tables 1, 2 and 3 show simulation parameters in the method. In addition, message bit sequences as input signals in different solutions are the same.

TABLE 1

| OFDM system parameters | |
| --- | --- |
| Names | Parameters |
| Number of subcarriers | N = 256 |
| Channel | AWGN and Ralymd |

TABLE 1-continued

| OFDM system parameters | |
| --- | --- |
| Names | Parameters |
| Modulation mode | QPSK |
| Auxiliary verification information index | S = {5, 30, 55, 80, 105} |
| Frame length | $N_{sym} = 8$ |

TABLE 2

| CRC verification parameters | | |
| --- | --- | --- |
| Names | Parameters | Parameter values |
| CRC-4 | $x^4 + x + 1$ | 10011 |
| Number of check bits | r | 4 |
| CRC codeword | C (g, r) | A (g), g ∈ (n' − k + 1, n') |
| Number of CRC codewords | g | 16 |

TABLE 3

| SLM parameter | | |
| --- | --- | --- |
| Names | Parameters | Parameter values |
| Number of phase sequences | Q | 4 or 8 |

Figure 3:
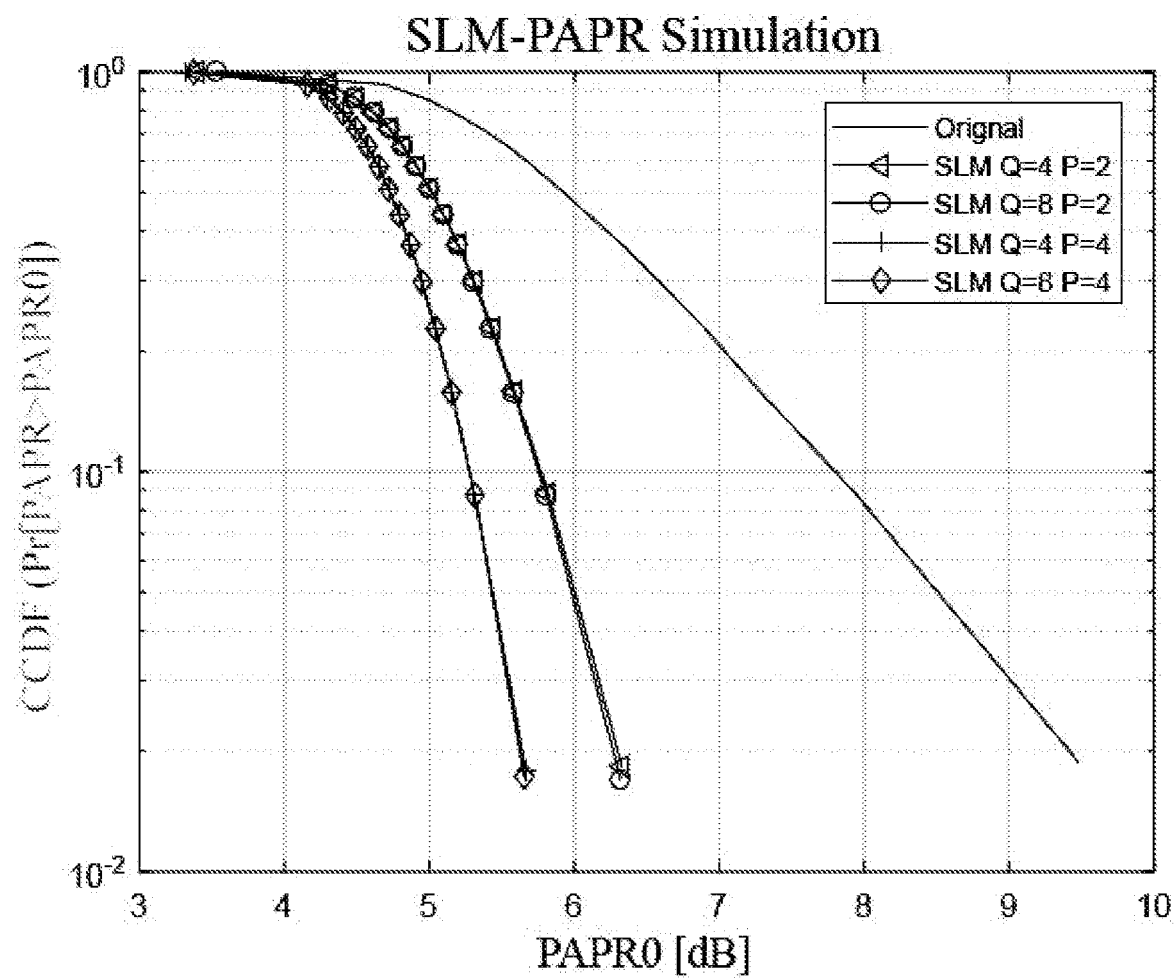
FIG. 3 is a schematic diagram showing a comparison of suppression performances of PAPR corresponding to different parameters in an SLM algorithm.

Suppression performance on a PAPR is evaluated by using a complementary cumulative distribution function (CCDF) of the PAPR. The function represents a probability of a PAPR exceeding a threshold PAPR0. FIG. 3 shows suppression performances on the PAPR corresponding to different solutions. The phase factor $\varphi_{q,n}=\{\pm\pi\}$ (corresponding to the solution with P=2 in FIG. 3) or the phase factor $$\varphi_{q,n} = \left\{\pm\pi, \pm\frac{\pi}{2}\right\}$$

(corresponding to the solution with P=4 in FIG. 3). It can be clearly seen from FIG. 3 that the suppression effect on the peak-to-average power ratio with the method according to the present disclosure is similar to the suppression effect on the peak-to-average power ratio with the P-NSI-SLM algorithm.

Figure 4:
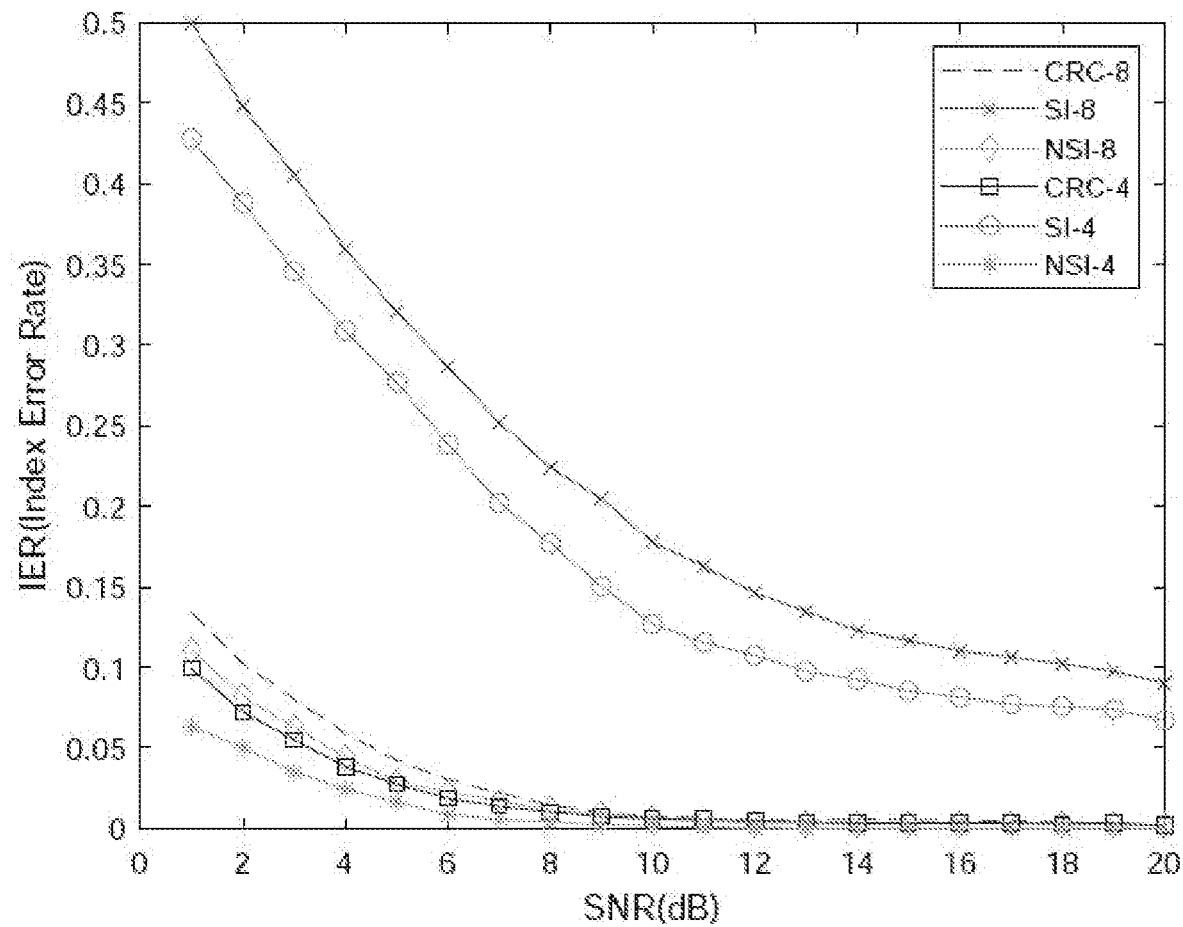
FIG. 4 shows phase index error rates corresponding to different solutions in a case of recovering a phase sequence by using a Rayleigh channel.

FIG. 4 shows phase index error rates (IERs) corresponding to different solutions in a case of recovering a phase sequence by using a Rayleigh channel. The IER is positively correlated with the number of the phase sequence groups. Compared with the SI-SLM solution, the influence of noise on the phase index decoding can be effectively reduced in the CRC-NSI-SLM solution and the P-NSI-SLM solution that adopt ML. In addition, with the CRC-NSI-SLM solution and the P-NSI-SLM solution, a good phase sequence recovery result can be achieved with high SNR.

Figure 5:
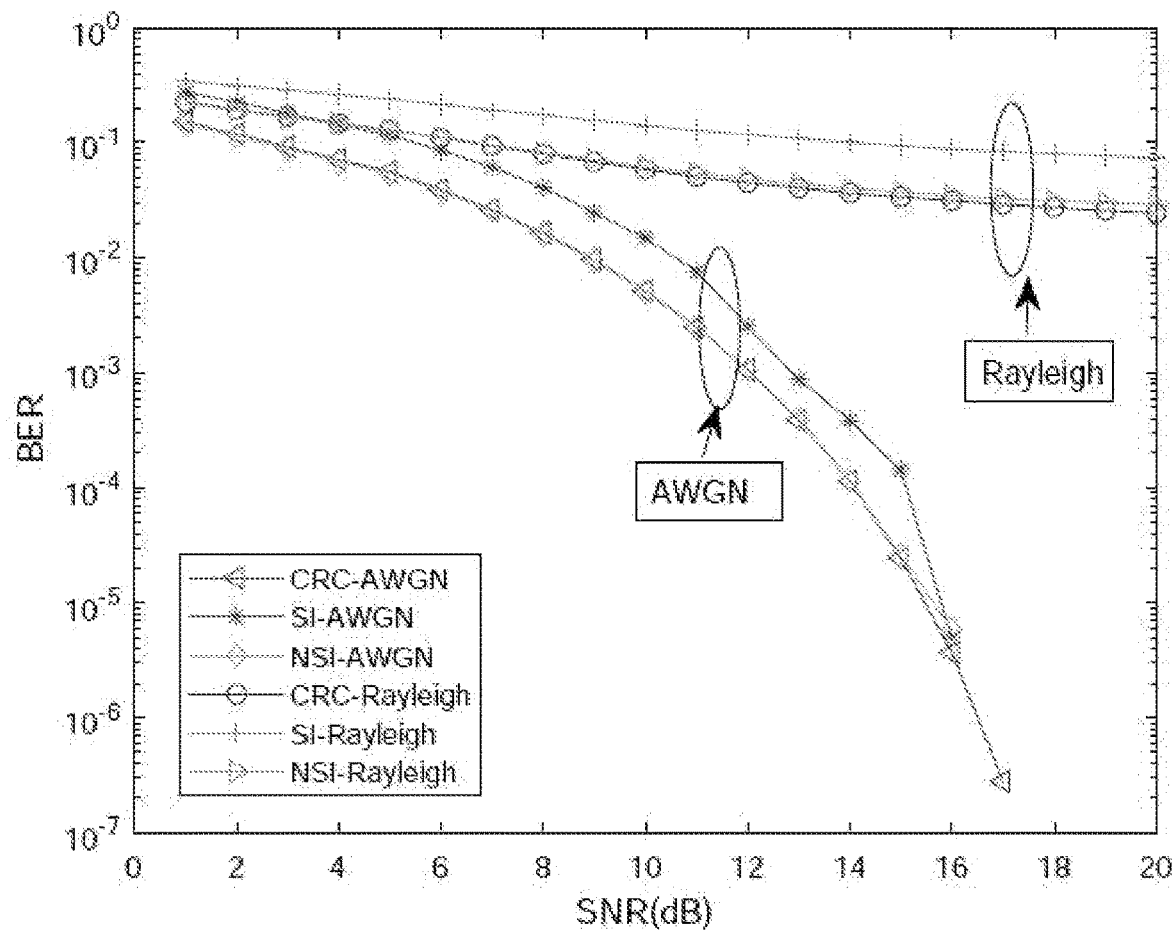
FIG. 5 shows BERs corresponding to different channels according to different solutions.

The recovery of the phase sequence index is affected by noise, and false recovery of the phase sequence index results in an increase in the BER of the SLM algorithm. FIG. 5 shows BERs corresponding to different channels according to different solutions. The SI-SLM solution has a higher BER than the other two solutions due to that the SI-SLM solution has a higher IER. Since different phase sequences may have a same phase factor at a same subcarrier position, the BER of the SI-SLM solution is not as high as expected.

That is, an incorrect phase sequence index does not cause the message bits of the entire OFDM symbol to be incorrectly decoded. Apparently, with the method according to the present disclosure, the phase sequence can be effectively recovered, and a BER similar to the BER of the P-NSI-SLM solution can be achieved.

In the present disclosure, the complexity of the solution in the document of Low Complexity Data Decoding for SLM-based OFDM Systems without Side Information (abbreviated as CP-NSI-SLM) is compared with the complexity of the present disclosure (abbreviated as CRC-NSI-SLM). The complexity of determining q is shown in Table 4.

TABLE 4

Computation complexity comparison

| Operation mode | CP-NSI-SLM | CRC-NSI-SLM |
|---|---|---|
| Complex multiplication | $3Q \cdot \left\lceil \frac{N_p - 1}{2} \right\rceil$ | $m + \left[ E(i) \cdot g + \sum_{1}^{Q-1} i \left( \frac{1}{2^r} + BER \right) \cdot 2m \right] + 2m$ |
| Addition | $Q * \left\lfloor \frac{N_p - 1}{2} \right\rfloor$ | $3m + \left( \frac{1}{2^r} BER \right) Qm$ |

Figure 6:
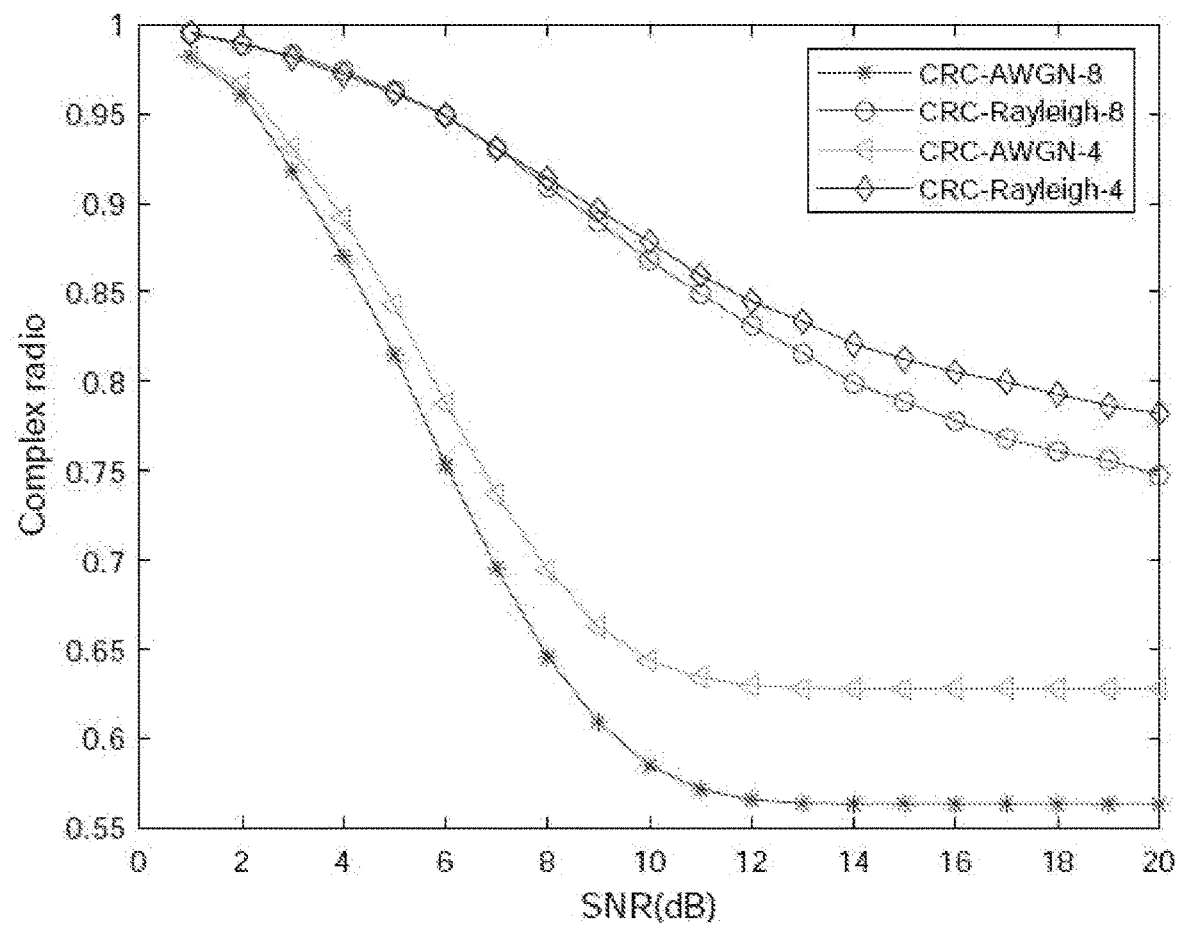
FIG. 6 shows a comparison of computation complexity ratios of different algorithms.

FIG. 6 shows a comparison of computation complexity ratios. In a case that the number of symbols is large enough, a phase sequence q is equally distributed in (1, 2 ... Q). Due to bit errors and missed detections, an expectation E(i) of a phase sequence i may be expressed as:

$$E(i) \approx \left[ \frac{\sum_{q=1}^{Q} q}{Q} + \sum_{q=1}^{Q-1} q \left( \frac{1}{2^r} + BER \right) \right]$$

It can be seen from the Table 4 that Q and the IER have different weights for the complexity of multiplication and the complexity of addition.

Table 5 shows actual CCRR values corresponding to the CRC-NSI-SLM solution and P-NSI-SLM solution. CCRR is defined as:

$$CCRR = \left( 1 - \frac{\text{complexity of } CRC - NSI - SLM}{\text{complexity of } P - NSI - SLM} \right) \times 100\%$$

By analyzing the data in Table 5, it can be seen that the complexity of the multiplication is affected by Q and BER. The IER increases with the increase of BER. The false recovery of the phase sequence index results in the increase of the number of the CRC calculations, thereby reducing the system performance. In addition, a larger Q indicates a more obvious effect of stopping calculation early. The complexity of the addition is mainly caused by calculating the phase rotation sequence index recovery value q̂ by using the ML algorithm in the present disclosure, and is greatly affected by Q. In addition, since the weight of the number $N_p$ of subcarriers is greater than m and g in a case that Q is constant, the CCRRs of the complexity of the multiplication and the complexity of the addition increases with the number of the subcarriers.

TABLE 5

Computation complexity of q̂

| Type of SLM | Multiplication | addition |
|---|---|---|
| CRC4, Q = 8, WAGN | 59.81% | 75.40% |
| CRC4, Q = 4, WAGN | 45.75% | 50.10% |
| CRC4, Q = 8, Ralyrnd | 48.54% | 75.25% |
| CRC4, Q = 4, Ralyrnd | 36.40% | 50.04% |

By comparing the IERs, BERs and computation complexities of the SI-SLM solution, the P-NSI-SLM solution and the CRC-NSI-SLM solution in different cases, it is shown that PAPR can be effectively suppressed with the method according to the present disclosure. Compared with the P-SNI-SLM solution, a greater computation gain can be achieved with the CRC-NSI-SLM solution without increasing the BER. In addition, it can be seen from the analysis of the calculation equations that CCRR is positively proportional to the number of subcarriers and the number of the phase sequence groups, and is inversely proportional to the BER.

Although the embodiments of the present disclosure are shown and described, those skilled in the art can understand that various changes, modifications, substitutions and alterations can be made to these embodiments without departing from the principle and purpose of the present disclosure, and the scope of the present disclosure is defined by the claims and their equivalents.

The invention claimed is:

1. A low-complexity selective mapping method using cyclic redundancy check, comprising:
   adding, by a transmitter in performing coding, a check bit and an auxiliary check bit to information bits to be transmitted, and then performing modulation, by the transmitter, to obtain modulated data A(n);
   multiplying, by the transmitter, the modulated data A(n) to be transmitted by Q groups of different phase sequences to perform phase rotation to obtain a modulation symbol A'(n), and transmitting, by the transmitter, a sequence with a smallest PAPR;
   performing demodulation on an M-order modulation symbol Â'$_Q$(n) received by a receiver to obtain a decoding result of a coding polynomial of the modulation symbol and bit information received by the receiver;
   calculating a modulo-2 division result of the decoding result of the coding polynomial and a generation polynomial;
   in a case that a remainder of the modulo-2 division result is not equal to zero, performing a next iteration until the remainder of the modulo-2 division result is equal to zero or the number of iterations is equal to Q;

in a case that a remainder of the modulo-2 division result is equal to zero, if modulation data corresponding to an index directory s(m) is consistent with a decoding result of auxiliary check information in an i-th iteration corresponding to the directory, that is, $A(s(m))=\hat{A}_i(s(m))$ and auxiliary verification is successful, stopping the i-th iteration, and outputting a current value of i as a phase rotation sequence index recovery value; and if $A(s(m)) \neq \hat{A}_i(s(m))$, and auxiliary verification fails, determining whether the number of iterations is equal to Q, performing a next iteration in a case that the number of iterations is not equal to Q, and performing an ML algorithm on $\hat{A}_i(s(m))$ to obtain a phase rotation sequence index recovery value in a case that the number of iterations is equal to Q; and obtaining a decoded signal by the receiver based on the phase rotation sequence index recovery value and a received modulation symbol Y'(n') after the check bit is removed.

2. The low-complexity selective mapping method using cyclic redundancy check according to claim 1, wherein the information bit after being adding with the check bit by the transmitter is expressed as:

$$A(n) = \begin{cases} 0 & n = (2s(m)-1, 2s(m)) & 1 \leq m \leq \frac{n}{2} \\ A(n) & n \neq (2s(m)-1, 2s(m)) & n = (1, 2 \ldots n') \\ R(l) & l = (1, 2, \ldots r) & n = (n'+1, n'+2 \ldots n'+r) \end{cases}$$

where A(n) represents the information bit after being added with the check bit by the transmitter; one symbol comprises n bits, comprising r check bits, m auxiliary check bits, and n' data bits to be transmitted; s(m) represents an m-th element in an index vector of a QPSK modulation symbol of A(n); and R(l) represents an l-th check bit.

3. The low-complexity selective mapping method using cyclic redundancy check according to claim 1, wherein the M-order modulation symbol $\hat{A}'_Q(n)$ received by the receiver is expressed as:

$$\hat{A}'_Q(n) = U_Q Y(n)$$

where $U_Q$ represents a phase rotation matrix formed by the Q groups of different phase sequences, Y'(n) represents a modulation symbol obtained by performing IFFT transformation on a received signal, $\hat{H}(n)$ represents a channel response estimation value, and y(n) represents the received signal received by the receiver.

4. The low-complexity selective mapping method using cyclic redundancy check according to claim 1, wherein the coding polynomial is expressed as:

$$C(x) = A(x) \times x^r + R(x) = Q(x)G(x)$$

where C(x) represents the coding polynomial, A(x) represents an information polynomial, R(x) represents a remainder polynomial, Q(x) represents a quotient polynomial, and G(x) represents the generation polynomial.

5. The low-complexity selective mapping method using cyclic redundancy check according to claim 4, wherein the modulo-2 division result of the decoding result of the coding polynomial and the generation polynomial is expressed as:

$$\frac{\hat{R}_i(x)}{G(x)} = \frac{\hat{C}_i(x)}{G(x)} - \hat{Q}(x)$$

where $\hat{C}_i(x)$ represents a decoding result of the coding polynomial in an i-th iteration, $\hat{Q}(x)$ represents a decoding result of the quotient polynomial, and $\hat{R}_i(x)$ represents a decoding result of the remainder polynomial in the i-th iteration.

6. The low-complexity selective mapping method using cyclic redundancy check according to claim 1, wherein the ML calculation algorithm is performed on $\hat{A}_i(s(m))$ to obtain the phase rotation sequence index recovery value by using the following equation:

$$\hat{q} = \min_{i \in (1,Q)} \sum_{m=1}^{m} |\hat{A}'_i(s(m)) - A'(s(m))|^2$$

where m represents the number of the auxiliary check bits.

7. The low-complexity selective mapping method using cyclic redundancy check according to claim 1, wherein the receiver obtains the decoded signal based on the phase rotation sequence index recovery value and the received modulation symbol Y'(n') after the check bit is removed by using the following equation:

$$\hat{A}'(n') = Y'(n') \cdot U_{\hat{q}}$$

where $\hat{A}'(n')$ represents the decoded signal, and $U_{\hat{q}}$ represents a rotation phase corresponding to the phase rotation sequence index recovery value.

* * * * *